United States Patent
Chiu et al.

(10) Patent No.: US 12,148,805 B2
(45) Date of Patent: *Nov. 19, 2024

(54) SEMICONDUCTOR STRUCTURE WITH WRAPAROUND BACKSIDE AMORPHOUS LAYER

(71) Applicant: Taiwan Semiconductor Manufacturing Company, Ltd., Hsinchu (TW)

(72) Inventors: Shih-Chuan Chiu, Hsinchu (TW); Huan-Chieh Su, Tianzhong Township (TW); Pei-Yu Wang, Hsinchu (TW); Cheng-Chi Chuang, New Taipei (TW); Chun-Yuan Chen, Hsinchu (TW); Li-Zhen Yu, New Taipei (TW); Chia-Hao Chang, Hsinchu (TW); Yu-Ming Lin, Hsinchu (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,864

(22) Filed: Aug. 9, 2023

(65) Prior Publication Data

US 2023/0387225 A1    Nov. 30, 2023

Related U.S. Application Data

(63) Continuation of application No. 17/331,350, filed on May 26, 2021, now Pat. No. 11,777,003.

(51) Int. Cl.
*H01L 29/417* (2006.01)
*H01L 29/06* (2006.01)
(Continued)

(52) U.S. Cl.
CPC .... *H01L 29/41733* (2013.01); *H01L 29/0665* (2013.01); *H01L 29/263* (2013.01);
(Continued)

(58) Field of Classification Search
CPC ........... H01L 29/41733; H01L 29/0665; H01L 29/263; H01L 29/401; H01L 29/41775;
(Continued)

(56) References Cited

U.S. PATENT DOCUMENTS 11,777,003 B2 * 10/2023 Chiu ................. H01L 29/42392
257/401
2010/0295022 A1 * 11/2010 Chang ................. H01L 29/0665
257/E21.294
(Continued)

OTHER PUBLICATIONS

Non-Final Office Action on U.S. Appl. No. 17/331,350 DTD Mar. 24, 2023.
(Continued)

*Primary Examiner* — Tong-Ho Kim
(74) *Attorney, Agent, or Firm* — POLEY & LARDNER LLP (57) ABSTRACT

A semiconductor structure includes an epitaxial region having a front side and a backside. The semiconductor structure includes an amorphous layer formed over the backside of the epitaxial region, wherein the amorphous layer includes silicon. The semiconductor structure includes a first silicide layer formed over the amorphous layer. The semiconductor structure includes a first metal contact formed over the first silicide layer.

20 Claims, 7 Drawing Sheets

(51) Int. Cl.
 *H01L 29/26* (2006.01)
 *H01L 29/40* (2006.01)
 *H01L 29/423* (2006.01)
 *H01L 29/786* (2006.01)

(52) U.S. Cl.
 CPC ...... *H01L 29/401* (2013.01); *H01L 29/41775* (2013.01); *H01L 29/42392* (2013.01); *H01L 29/78696* (2013.01)

(58) Field of Classification Search
 CPC ......... H01L 29/42392; H01L 29/78696; H01L 21/28518; H01L 21/28525; H01L 21/76897; H01L 21/76898; H01L 29/4175; H01L 29/0847; H01L 29/0673; H01L 29/66439; H01L 29/775; H01L 29/785; H01L 2221/1078; H01L 27/0886; H01L 21/823431; H01L 21/823437; H01L 21/823475; H01L 21/823821; H01L 21/823828; H01L 21/823871; H01L 27/0924; H01L 29/1604; B82Y 10/00
 USPC ....................................................... 257/401
 See application file for complete search history.

(56) References Cited

U.S. PATENT DOCUMENTS

2013/0001555 A1 1/2013 Yin et al.
2019/0341448 A1* 11/2019 Bourjot ................. H01L 29/775

OTHER PUBLICATIONS

Notice of Allowance on U.S. Appl. No. 17/331,350 DTD Jul. 17, 2023.

* cited by examiner

SEMICONDUCTOR STRUCTURE WITH WRAPAROUND BACKSIDE AMORPHOUS LAYER

CROSS-REFERENCE TO RELATED APPLICATION

This application is a continuation of U.S. patent application Ser. No. 17/331,350, filed May 26, 2021, and titled "SEMICONDUCTOR STRUCTURE WITH WRAPAROUND BACKSIDE AMORPHOUS LAYER," the entire contents of which are incorporated herein by reference for all purposes.

BACKGROUND

The present disclosure generally relates to semiconductor devices and methods for fabricating semiconductor devices, and particularly to interconnect structures formed in circuits containing semiconductor devices. As the size of semiconductor devices continues to decreases, challenges may arise during the integrated circuit fabrication process with respect to forming effective and reliable interconnect structures. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor structure and method of fabricating the same. The semiconductor structure includes an amorphous layer formed over an epitaxial region of the semiconductor structure in order to improve reliability. In various embodiments, the amorphous layer, which is silicon-based, may be formed around a backside of the epitaxial region (e.g., straddling a bottom surface and at least portions of sidewalls of the epitaxial region). By forming such an amorphous layer, bonding between the epitaxial region and a silicide layer later formed over the backside of the epitaxial region can be enhanced, which can significantly reduce the contact resistance of a corresponding contact.

For example, the surfaces on the backside of the epitaxial region can be "modified" by the amorphous layer, which is selective grown (e.g., deposited), instead of being modified by implantation (as typically used in the existing technologies). Using implantation is frequently subjected to inefficient modification issues, for example, the sidewalls of the epitaxial region are not modified partially due to the limited space that exposes the sidewalls. The backside surfaces of the epitaxial region are only partially modified, and a silicide layer cannot well surround the surfaces. Consequently, the contact resistance cannot be effectively reduced. By contrast, using deposition techniques to grow the disclosed amorphous layer, the exposed surfaces on the backside of the epitaxial region can be well wrapped by the amorphous layer, which causes the silicide layer to fully wrap the epitaxial region through this amorphous layer. As a result, the contact resistance can be significantly reduced through such a fully wrapped silicide layer.

Figure 1A:
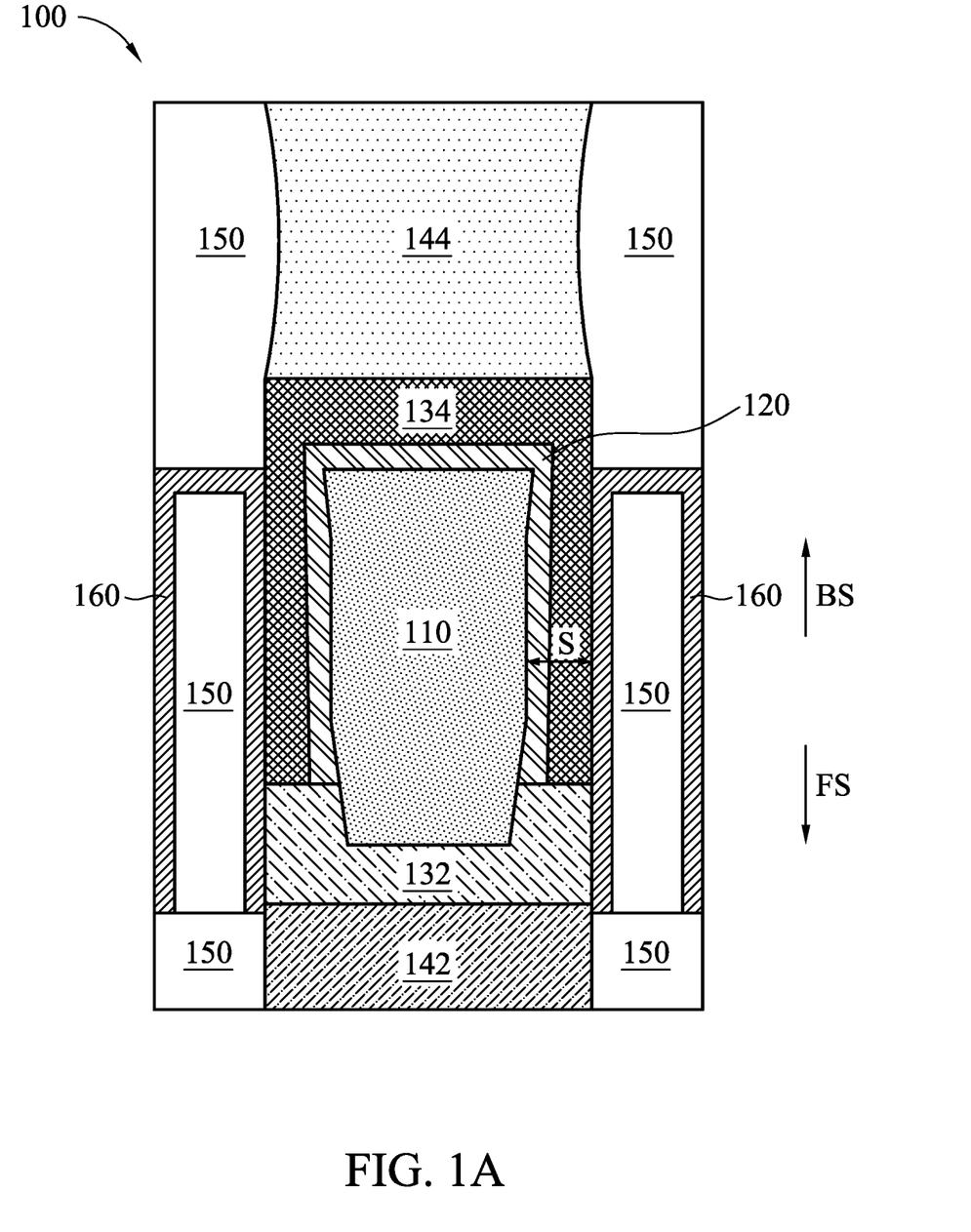
FIG. 1A illustrates a cross section of an example semiconductor structure with a wraparound backside amorphous layer, in accordance with some embodiments.
Figure 1B:
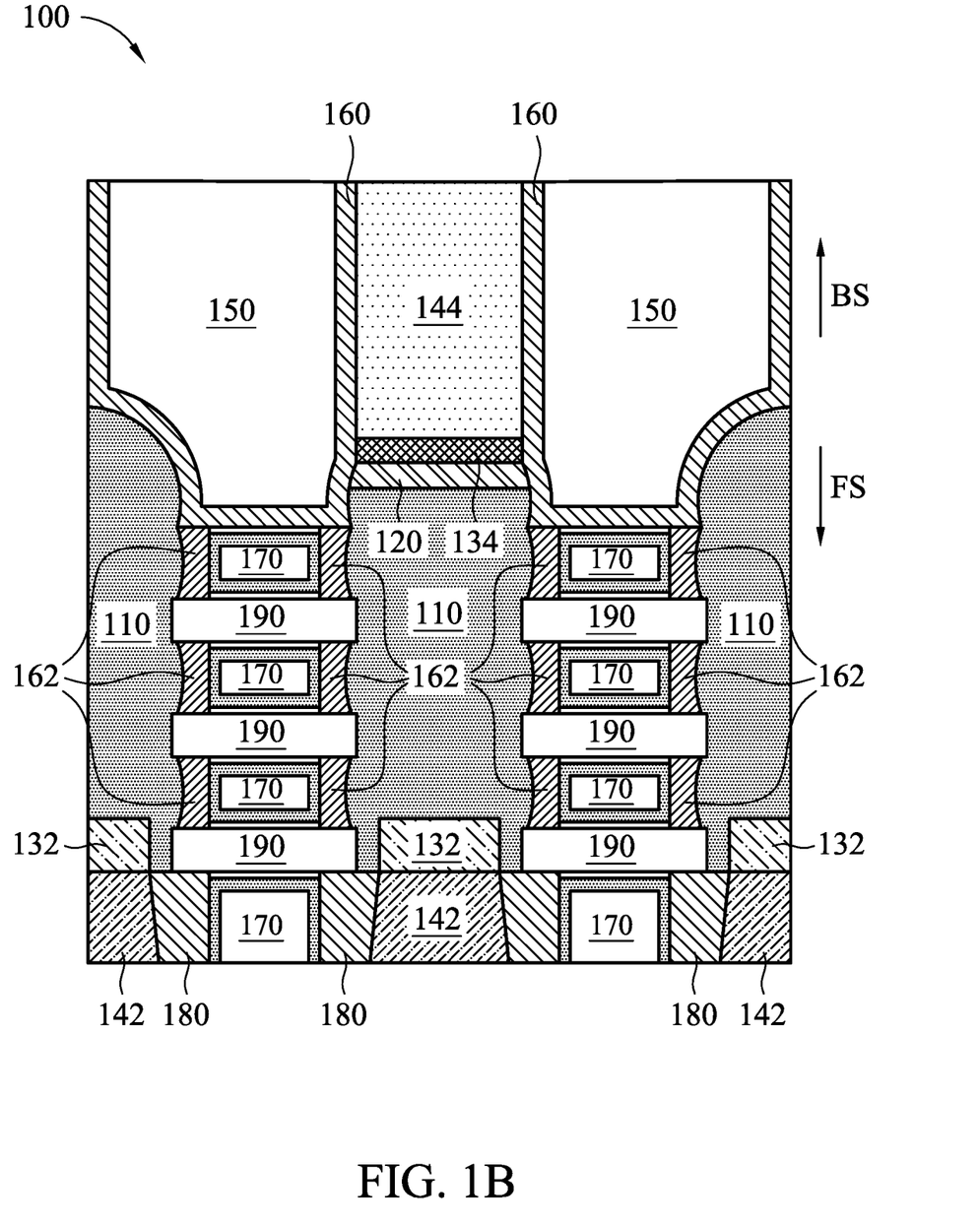
FIG. 1B illustrates another cross section of the example semiconductor structure of FIG. 1A, in accordance with some embodiments.

FIGS. 1A-B respectively provide brief overviews of an example semiconductor structure 100 including the disclosed amorphous layer. In FIG. 1A, a cross-sectional view of semiconductor structure 100 is shown, in accordance with some embodiments. The cross-sectional view FIG. 1A is cut over an epitaxial region and along a lengthwise direction of a gate structure of semiconductor structure 100 (sometimes referred to as "Y-cut"), whereas FIG. 1B illustrates another cross-sectional view of semiconductor structure 100 that is cut along a lengthwise direction of a channel of semiconductor structure 100 (sometimes referred to as "X-cut"). It should be noted that the cross-sectional views of FIGS. 1A-B are upside down, in some embodiments. For example, a backside (hereinafter "BS") of semiconductor structure 100 is illustrated as being on top of a front side (hereinafter "FS") of semiconductor structure 100.

Semiconductor structure 100 is generally a transistor structure as implemented in an integrated circuit. The transistor structure is electrically coupled to conductive interconnects for routing electrical signals through the integrated circuit. As feature size of semiconductor devices such as transistors decreases, challenges in fabricating reliable semiconductor structures can arise. Semiconductor structure 100 includes an amorphous layer formed over an epitaxial region as discussed in more detail below to improve the reliability of the semiconductor structure.

Semiconductor structure 100 is shown to include an epitaxial region (or otherwise epitaxial feature) 110. The epitaxial region 110 can serve as a source terminal and/or a drain terminal of a transistor, for example. Epitaxial region 110 is generally crystalline structures that can be formed using epitaxial growth processes such as vapor-phase epitaxy (VPE), molecular-beam epitaxy (MBE), liquid-phase epitaxy (LPE), and other suitable processes and combinations thereof. Epitaxial region 110 can be doped using suitable dopants, including both n-type and p-type dopants, including boron and antimony. Epitaxial region 110 includes epitaxially grown silicon or doped silicon, such as silicon germanium (SiGe), silicon arsenide (SiAs), silicon gallium (SiGa), antimony-doped silicon, phosphorous-doped silicon, and other suitable materials and combinations thereof. In some embodiments, a concentration of silicon ranges from about 30% to about 80%. If the concentration of silicon is greater than 80%, it is insufficient to form silicide layer, resulting in high electrical resistance. If the concentration of silicon is smaller than 30%, the defects increase during the amorphization process, in some instances.

Semiconductor structure 100 is also shown to include an amorphous layer 120. Amorphous layer 120 is formed on epitaxial region 110 in order to reduce contact resistance between epitaxial region 110 and a silicide layer 134 as discussed below. Amorphous layer 120 generally has many dangling silicon bonds such that metal can combine with silicon in order to form a better electrical interface. Amorphous layer 120 can also constrain metal diffusion depth for better reliability. As a result, reliability of semiconductor structure 100 can generally be improved. In some embodiments, a thickness of amorphous layer 120 can range from about 2 nanometers (nm) to about 10 nm, which may vary according to a spacing, "S (as indicated in FIG. 1A)," between epitaxial region 110 and an adjacent feature. However, it should be appreciated that thicknesses outside of this range can also be contemplated, while remaining within the scope of the present disclosure. For example, if the thickness of amorphous layer 120 is too thin (e.g., less than 2 nm), the surfaces of epitaxial region 110 may not be well wrapped by of amorphous layer 120, which can cause a later formed silicide layer to be unable to provide the desired interface enhancement; and if the thickness of amorphous layer 120 is too thick (e.g., greater than nm), amorphous layer 120 may overfill the spacing, which can cause a later formed silicide layer to be unable to fully wrap the backside surfaces of epitaxial region 110. Amorphous layer 120 can be formed of suitable materials including silicon germanium doped with boron (SiGe:B), silicon phosphorous (SiP), silicon arsenic (SiAs), silicon gallium (SiGa), and silicon doped with antimony.

Semiconductor structure 100 is also shown to include a silicide layer 132 in addition to silicide layer 134. In various embodiments, silicide layer 132 may be a front side silicide layer, whereas silicide layer 134 may be a backside silicide layer. When viewed upside-down (with the FS on top of BS), a metal contact 142 is formed over silicide layer 132 to allow a number of interconnect structures formed on the FS (not shown) to electrically connect the epitaxial region 110 through silicide layer 132. Metal contact 142 is sometimes referred to as a FS contact. Silicide layer 134 is also formed adjacent to dielectric layer 160 as discussed below. Silicide layer 132 generally provides an interface between epitaxial region 110 and metal contract 142. Silicide layer 132 is formed on amorphous layer 120 to provide an interface between epitaxial region 110 and a metal contact 144 to allow a number of interconnect structures formed on the BS (not shown) to electrically connect the epitaxial region 110 through silicide layer 134. Metal contact 144 is sometimes referred to as a BS contact.

As shown in FIG. 1A, silicide layer 134 is formed adjacent oxide layers 150 discussed below, dielectric layers 160, and metal contact 144. In some embodiments, a thickness of silicide layer 132 ranges from 2 nanometers to 10 nanometers, however thicknesses outside of this range are also contemplated. In some embodiments, a thickness of silicide layer 134 ranges from 2 nanometers to 10 nanometers, however thicknesses outside of this range are also contemplated. Silicide layer 132 and silicide layer 134 can be formed using suitable materials including titanium silicide (TiSi), chromium silicide (CrSi), tantalum silicide (TaSi), molybdenum silicide (MoSi), zirconium silicide (ZrSi), hafnium silicide (HfSi), scandium silicide (ScSi), yttrium silicide (YSi), holmium silicide (HoSi), terbium silicide (TbSi), gadolinium silicide (GdSi), lutetium silicide (LuSi), dysprosium silicide (DySi), erbium silicide (ErSi), ytterbium silicide (YbSi), nickel silicide (NiSi), cobalt silicide (CoSi), manganese silicide (MnSi), tungsten silicide (WSi), iron silicide (FeSi), rhodium silicide (RhSi), palladium silicide (PdSi), ruthenium silicide (RuSi), platinum silicide (PtSi), iridium silicide (IrSi), osmium silicide (OsSi), and other suitable materials and combinations thereof.

Metal contact 142 is formed adjacent silicide layer 132 in order to provide an electrical interface to epitaxial region 110. Metals contact 144 is formed on and adjacent to silicide layer 134 in order to provide another electrical interface to epitaxial region 110. Metal contact 142 and metal contact 144 are also formed adjacent oxide layers 150 and dielectric layers 160 as illustrated in FIG. 1A. Metal contact 142 and metal contact 144 can be formed using suitable materials including cobalt (Co), tungsten (W), and ruthenium (Ru) based compounds and alloys formed with elements including silver (Ag), copper (Cu), gold (Au), aluminum (Al), calcium (Ca), beryllium (Be), magnesium (Mg), rhodium (Rh), sodium (Na), iridium (Ir), tungsten (W), molybdenum (Mo), zinc (Zn), nickel (Ni), potassium (K), cobalt (Co), cadmium (Cd), ruthenium (Ru), indium (In), osmium (Os), silicon (Si), germanium (Ge), manganese (Mn), and other suitable materials and combinations thereof.

Semiconductor structure 100 is also shown to include a plurality of oxide layers 150. Oxide layers 150 generally provide electrical isolation within semiconductor structure 100. Semiconductor structure 100 is also shown to include a plurality of dielectric layers 160 which can also provide electrical isolation within semiconductor structure 100. For example, oxide layer 150 and dielectric layer 160 can collectively or respectively isolate epitaxial region 110 from other conductive features (e.g., neighboring epitaxial regions). Oxide layers 150 can be formed using suitable materials including silicon dioxide ($SiO_2$) and other suitable materials and combinations thereof. Dielectric layer 160 can be formed using suitable materials including silicon nitride (SiN), silicon carbon nitride (SiCN), silicon oxycarbon nitride (SiOCN), hafnium oxide (HfOx), aluminum oxide (AlOx), zirconium oxide (ZrOx), and other suitable materials and combinations thereof.

Referring now to FIG. 1B, semiconductor structure 100 is shown to include a number of gate structures 170. Gate structures 170 generally serve as gate terminals of individual transistor devices within semiconductor structure 100. Gate structures 170 can be implemented as metal gate structures, such as high-k metal gate (HKMG) structures. In such implementations, gate structures 170 each include a gate dielectric and a gate metal.

The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., SiOx) layer, which may be a native oxide layer.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

In FIG. 1B, semiconductor structure 100 is also shown to include a number of spacer structures 162 and a number of spacer structures 180. Spacer structures 180 are formed along the sides of a topmost portion of each gate structure 170 (when viewed upside-down) and spacer structures 162 are formed along the sides of the rest portion of each gate structure 170. Accordingly, spacer structures 180 and 162 are sometimes referred to as "gate spacers" and "inner spacers," respectively. Spacer structures 162/180 can be implemented using materials with a high dielectric constant (high-k materials) and/or materials with a low dielectric constant (low-k materials). For example, spacer structures 162/180 can be formed using suitable materials including silicon nitride (SiN), silicon carbon nitride (SiCN), silicon oxycarbon nitride (SiOCN), hafnium oxide (HfOx), aluminum oxide (AlOx), zirconium oxide (ZrOx), and other suitable materials and combinations thereof.

In FIG. 1B, semiconductor structure 100 is also shown to include a number of semiconductor layers 190. The semiconductor layers 190 can each be formed as a nanostructure, e.g., a nanosheet, a nanowire, a nanobridge, etc., and can collectively function as a channel of semiconductor structure 100 to conduct current flowing from one of its source/drain terminals to the other of its source/drain terminals. For example, the three semiconductor layers 190 on the left-hand side of FIG. 1B may function as the channel of a first transistor of semiconductor structure 100, and the three semiconductor layers 190 on the right-hand side of FIG. 1B may function as the channel of a second transistor of semiconductor structure 100. In various embodiments, the first and second transistors are each configured as a gate-all-around (GAA) transistor. As such, gate structure 170 (on the left) wraps around each of the three semiconductor layers 190 on the left; and gate structure 170 (on the right) wraps around each of the three semiconductor layers 190 on the right. It should be understood that semiconductor structure 100 can include any of various other types of transistors (e.g., FinFETs), while remaining within the scope of the present disclosure.

In some embodiments, each of the semiconductor layers 190 includes silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 190 (e.g., of silicon).

In some other embodiments, the semiconductor layers 190 may be intentionally doped. For example, when the GAA transistor is configured in n-type (and operates in an enhancement mode), each of the semiconductor layers 190 may be silicon that is doped with a p-type dopant such as boron (B), aluminum (Al), indium (In), and gallium (Ga); and when the GAA transistor is configured in p-type (and operates in an enhancement mode), each of the semiconductor layers 190 may be silicon that is doped with an n-type dopant such as phosphorus (P), arsenic (As), antimony (Sb). In another example, when the GAA transistor is configured in n-type (and operates in a depletion mode), each of the semiconductor layers 190 may be silicon that is doped with an n-type dopant instead; and when the GAA transistor is configured in p-type (and operates in a depletion mode), each of the semiconductor layers 190 may be silicon that is doped with a p-type dopant instead.

Semiconductor layers 190 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

It will be appreciated that semiconductor structure 100 can be include additional or different layers and/or materials beyond or in alternative to the layers and materials explicitly labeled and discussed with respect to FIG. 1A and FIG. 1B. For example, a variety of different spacer structures can be implemented to electrically isolate gate structures 170, including dielectric materials with a high dielectric constant (high-k materials) and materials with a low dielectric constant (low-k materials). Moreover, only a selected portion of an integrated circuit in which semiconductor structure 100 is implemented is expressly illustrated in the present disclosure. The discussion of amorphous layer 120 as provided herein can be applied in a variety of different semiconductor applications.

Figure 2A:
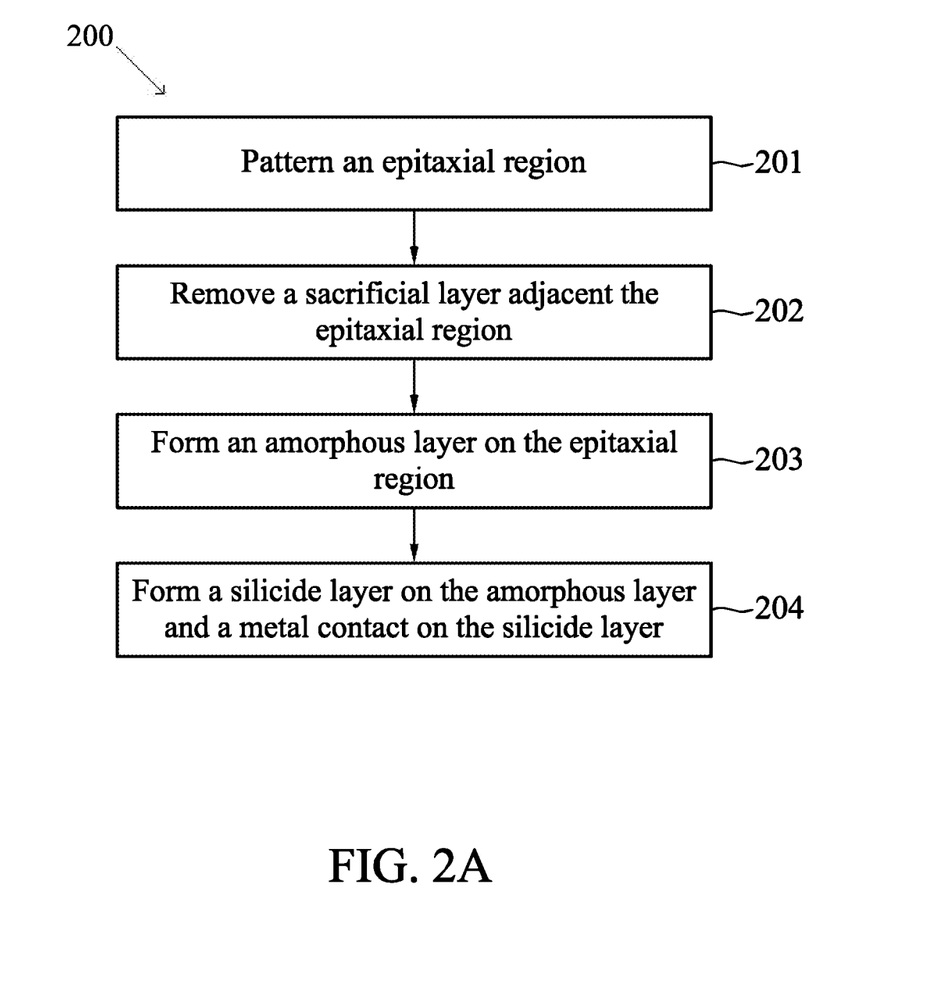
FIG. 2A is a flow diagram illustrating an example process for fabricating the semiconductor structure of FIG. 1A, in accordance with some embodiments.

Referring now to FIG. 2A, a flow diagram illustrating an example process 200 for fabricating semiconductor structure 100 is shown, in accordance with some embodiments. It should be noted that process 200 is merely an example, and is not intended to limit the present disclosure. Accordingly, it is understood that additional steps/operations may be provided before, during, and after process 200 of FIG. 2A, and that some other operations may only be briefly described herein. Steps of process 200 may be associated with cross-sectional views of example semiconductor structure 100 at various fabrication stages as shown in FIGS. 2B, 2C, 2D, and 2E, respectively, which will be discussed in further detail below.

In brief overview, process 200 includes formation of amorphous layer 120 on the backside surfaces of epitaxial region 110 in order to provide an improved electrical interface between epitaxial region 110 and BS metal contact 144. By forming such an amorphous layer, the surface of epitaxial region 110 can be modified so as to provide better bonding between epitaxial region 110 and silicide layer 134. As a result, the contact resistance of BS metal contact 144 that electrically connects epitaxial region 110 (through silicide layer 134) can be significantly reduced.

Figure 2B:
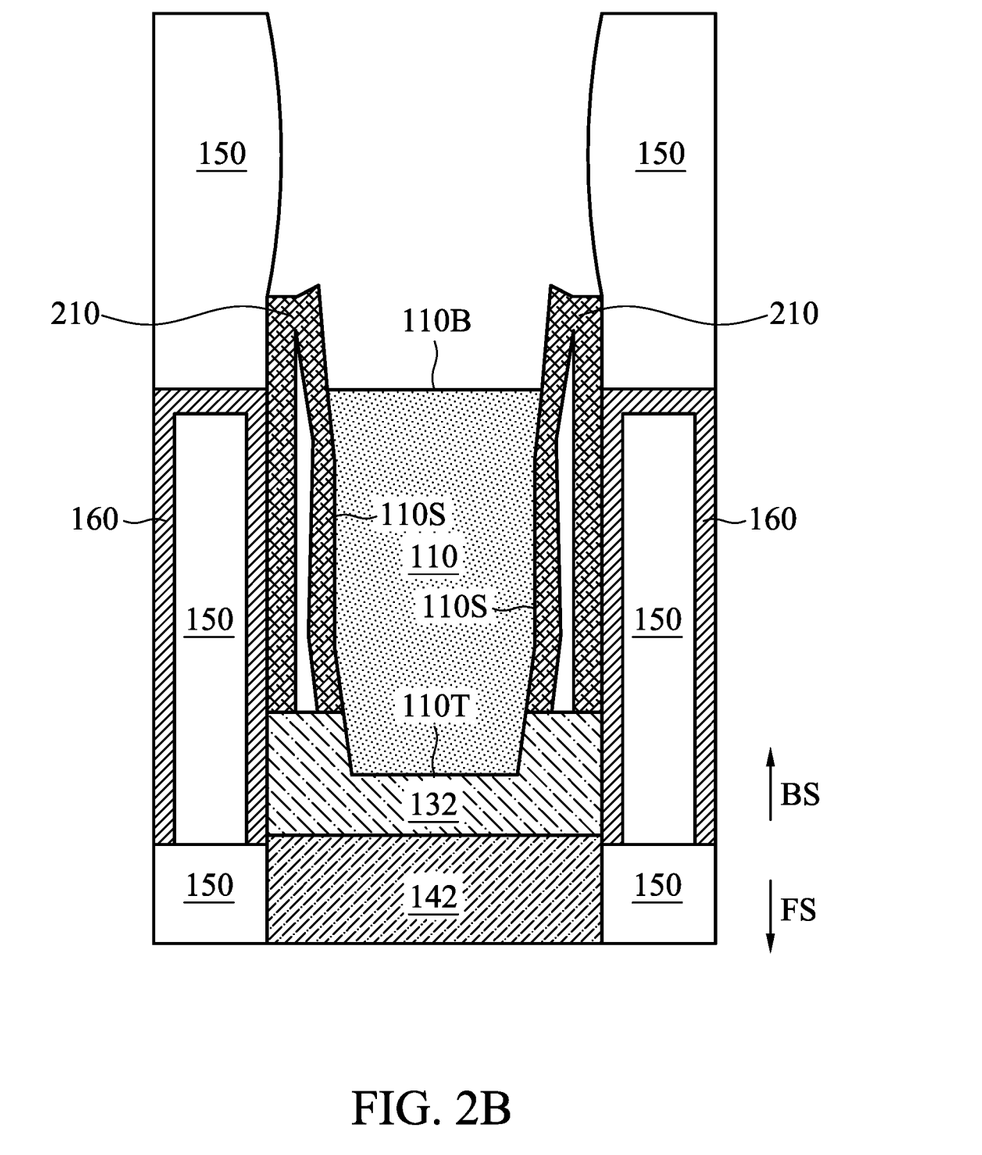
FIGS. 2B-2E illustrate cross sections of the semiconductor structure of FIG. 1A at various steps in the process of FIG. 2A, in accordance with some embodiments.

At a step 201, an epitaxial region is patterned (FIG. 2B). As illustrated in FIG. 2B, epitaxial region 110 is patterned in order to prepare epitaxial region 110 for further processing on the BS. In various embodiments, prior to patterning epitaxial region 110, various feature may have been formed on the FS. For example, after forming epitaxial region 110 (and gate structures 170 wrapping around each of the semiconductor layers 190) over a substrate, silicide layer 132 and metal contact 142 may be formed on the FS (of epitaxial region 110, or the substrate). Silicide layer 132 overlays a top surface of epitaxial region 110T and extends along a portion (e.g., an upper portion, when FIG. 2B is viewed upside-down) of each sidewall 110S. Subsequently, the substrate is flipped and a backside surface of the substrate is polished (e.g., by a chemical mechanical planarization (CMP) process), followed by one or more etching processes until a bottom surface of epitaxial region, 110B, is exposed.

Following the polishing process, a sacrificial layer 210 that is formed adjacent epitaxial region 110 may also be exposed. In some embodiments, sacrificial layer 210 may be formed prior to forming epitaxial region 110. Sacrificial layer 210 may be formed of a material that can be removed by a wet etching process such as, for example, a high-k dielectric material (e.g., HfOx, AlOx, ZrOx, etc.), a nitride-based material (e.g., SiN, SiCN, SiOCN, TiN, TaN), etc. For example, prior to forming epitaxial region 110, portions (e.g., end portions) of semiconductor layers 190 are removed to form trenches, and the trenches are then filled with sacrificial layer 210. Next, epitaxial region 110 is formed in each of the trenches. Accordingly, sacrificial layer 210 can surround the bottom surface 110B and a portion (e.g., a lower portion when FIG. 2B is viewed upside-down) of each of sidewalls 110S of epitaxial region 110. Thus, the etching process(es) following the polishing process can at least expose the bottom surface 110B.

In some embodiments, after flipping and polishing the backside surface of the substrate, portions of the substrate adjacent epitaxial region 110 can be replaced with oxide layers 150 and dielectric layers 160. Forming oxide layers 150 and dielectric layers 160 can electrically isolate neighboring epitaxial regions. Oxide layers 150 can be formed using suitable materials including silicon dioxide ($SiO_2$) and other suitable materials and combinations thereof. Dielectric layer 160 can be formed using suitable materials including silicon nitride (SiN), silicon carbon nitride (SiCN), silicon oxycarbon nitride (SiOCN), hafnium oxide (HfOx), aluminum oxide (AlOx), zirconium oxide (ZrOx), and other suitable materials and combinations thereof.

Figure 2C:
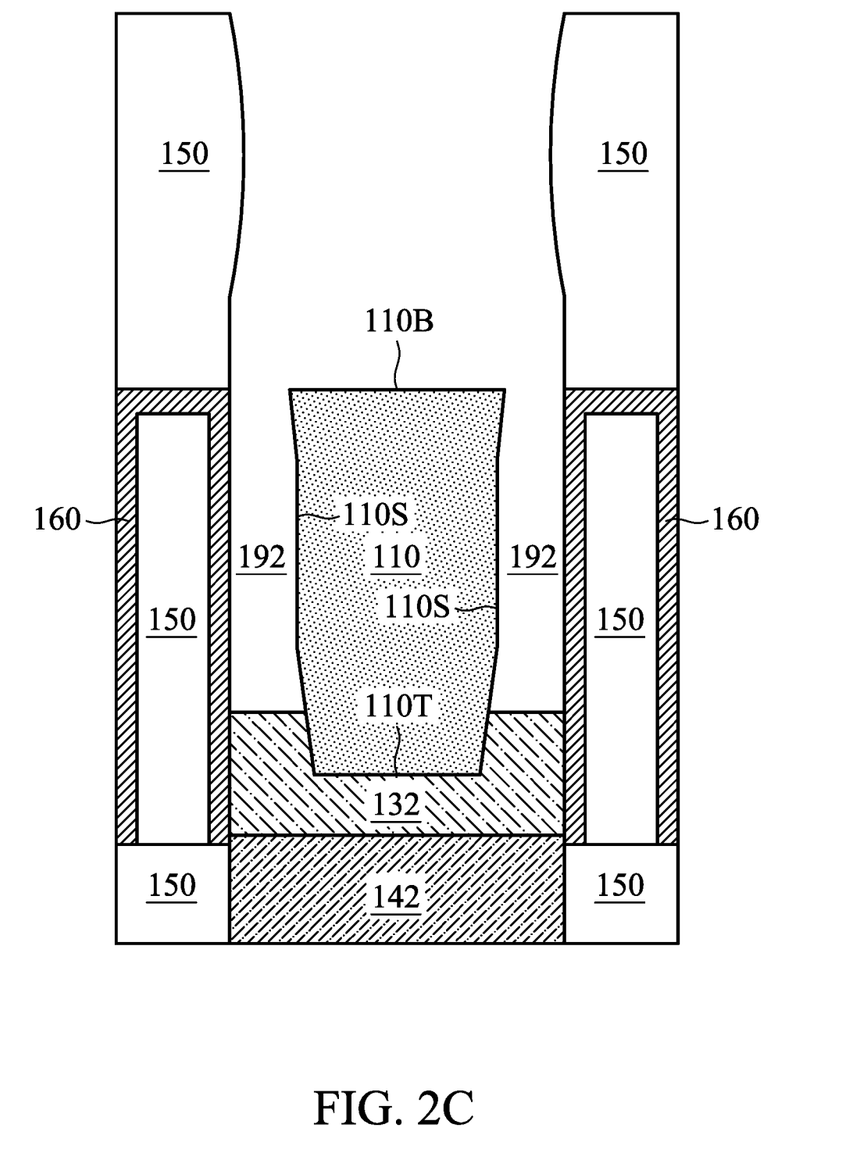

At a step 202, remaining portions of sacrificial layer adjacent the epitaxial region are removed (FIG. 2C). As illustrated in FIG. 2C, remaining portions of sacrificial layer 210 that are removed in order to further open a recess 192 for forming amorphous layer 120, and ultimately silicide layer 134 and metal contact 144. The use of sacrificial layer 210 can help ensure that proper clearance is maintained between oxide layers 150, dielectric layers 160, and epitaxial region 110 during the fabrication process. For example, upon removal of sacrificial layer 210, the recess 192 can expose the portions of sidewalls 110S that are not in contact with silicide layer 132.

In some embodiments, sacrificial layer 210 can be removed by a wet etching process. The wet etching process may be end-pointed on epitaxial region 110. The wet etch process is performed using a chemical. The chemical may include an acid and an oxidizer. In an example where sacrificial layer 210 includes TiN, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etching process may be performed at a temperature between about 40° C. and about 70° C. for a duration between about 1 minute and about 5 minutes, or else may be ended using an endpoint detection process.

Figure 2D:
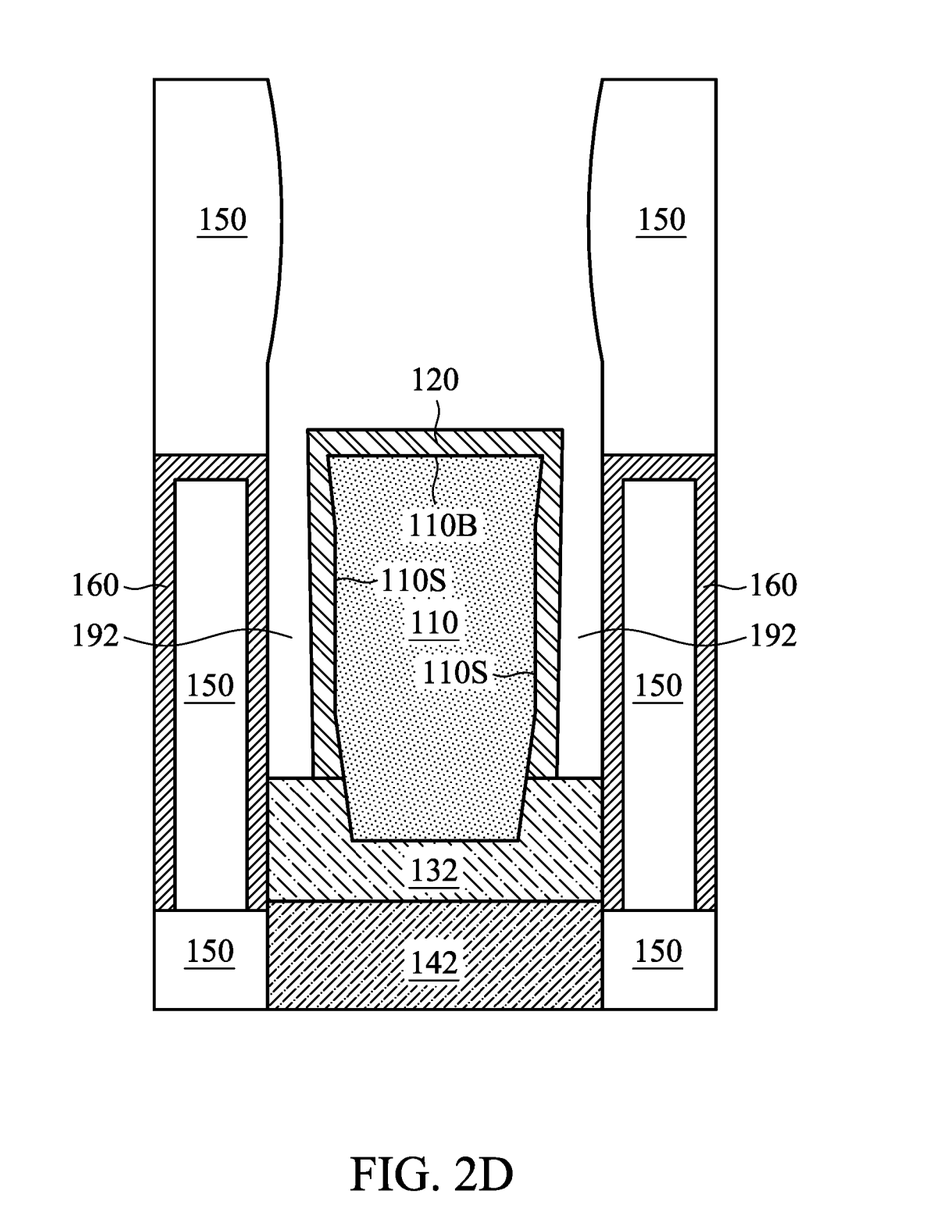

At a step 203, an amorphous layer is formed over the epitaxial region (FIG. 2D). As illustrated in FIG. 2D, amorphous layer 120 is selectively formed on epitaxial region 110. In various embodiments, amorphous layer 120 is selectively formed over the surface(s) that include silicon, e.g., the exposed bottom surface 110B and the exposed portions of the sidewalls 110S. Further, amorphous layer 120 may be controlled in a certain thickness to not fully fill recess 192, which can allow silicide layer 134 to fill recess 192. In various embodiments, amorphous layer 120 can be formed over epitaxial region 110 using a variety of suitable deposition techniques, including chemical vapor deposition (CVD), atomic layer deposition (ALD), other suitable processes and combinations thereof. By using such a selective deposition technique, the exposed surfaces of epitaxial region 110 can be "spontaneously" wrapped by amorphous layer 120 that includes significantly more silicon dangling bonds than epitaxial region 110 itself, which can provide an improved interface between epitaxial region 110 and silicide layer 134.

In various embodiments, amorphous layer 120 can be formed of suitable silicon-based materials For example, the silicon-based materials include silicon germanium doped with boron (SiGe:B), silicon phosphorous (SiP), silicon arsenic (SiAs), silicon gallium (SiGa), silicon doped with antimony, or combination thereof. To form the silicon-based amorphous layer, one or more of the following gaseous precursors, $SiCl_4$, $SiCH_4$, $SiH_4$, etc., can be used in the above-described deposition techniques.

Figure 2E:
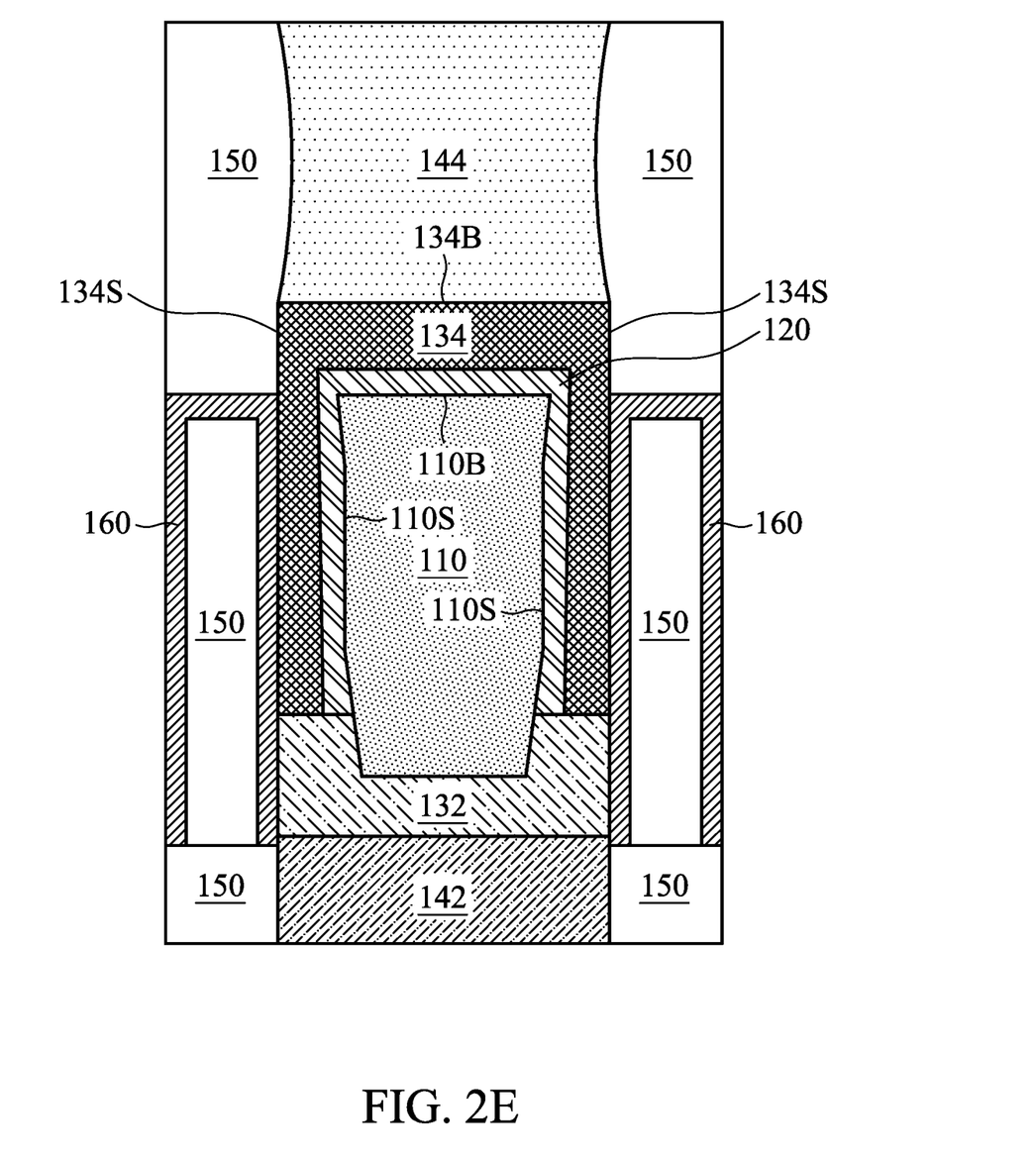

At a step 204, a silicide layer is formed on the amorphous layer, and a metal contact is formed on the silicide layer (FIG. 2E). As illustrated in FIG. 2E, silicide layer 134 is formed on amorphous layer 120, and metal contact 144 is formed on silicide layer 134. For example, silicide layer 134 wraps around bottom surface 110B and the portions of sidewalls 110S, with amorphous layer 120 sandwiched therebetween. Alternatively stated, in addition to overlaying the bottom surface 110B, recess 192 (FIG. 2D) is filled with silicide layer 134. Next, metal contact 144 is formed over silicide layer 134. In the illustrated embodiment of FIG. 2E where silicide layer 134 fully fills recess 192, metal contact 144 is formed in contact with a bottom surface of silicide layer 134B. In some other embodiments where silicide layer 134 partially fills recess 192, metal contact 144 is formed in contact with the bottom surface 134B and sidewalls 134S of silicide layer.

Silicide layer 134 can be formed on amorphous layer 120 using a variety of suitable processes, including chemical vapor deposition and other suitable processes and combinations thereof. Metal contact 144 can be formed on silicide layer 134 using a variety of suitable processes, including chemical vapor deposition and other suitable processes and combinations thereof.

Silicide layer 134 can be formed using suitable materials including titanium silicide (TiSi), chromium silicide (CrSi), tantalum silicide (TaSi), molybdenum silicide (MoSi), zirconium silicide (ZrSi), hafnium silicide (HfSi), scandium silicide (ScSi), yttrium silicide (YSi), holmium silicide (HoSi), terbium silicide (TbSi), gadolinium silicide (GdSi), lutetium silicide (LuSi), dysprosium silicide (DySi), erbium silicide (ErSi), ytterbium silicide (YbSi), nickel silicide (NiSi), cobalt silicide (CoSi), manganese silicide (MnSi), tungsten silicide (WSi), iron silicide (FeSi), rhodium silicide (RhSi), palladium silicide (PdSi), ruthenium silicide (RuSi), platinum silicide (PtSi), iridium silicide (IrSi), osmium silicide (OsSi), and other suitable materials and combinations thereof.

Metal contact 144 can be formed using suitable materials including cobalt (Co), tungsten (W), and ruthenium (Ru) based compounds and alloys formed with elements including silver (Ag), copper (Cu), gold (Au), aluminum (Al), calcium (Ca), beryllium (Be), magnesium (Mg), rhodium (Rh), sodium (Na), iridium (Ir), tungsten (W), molybdenum (Mo), zinc (Zn), nickel (Ni), potassium (K), cobalt (Co), cadmium (Cd), ruthenium (Ru), indium (In), osmium (Os), silicon (Si), germanium (Ge), manganese (Mn), and other suitable materials and combinations thereof.

It will be appreciated that various adaptations to process 200 are possible and contemplated within the scope of the present disclosure. For example, in certain application, use of sacrificial layer 210 may not be necessary. Moreover, different layers and materials can be used for various different purposes during the fabrication process. Those skilled in the art will appreciated such adaptations in view of the discussion presented herein with respect to amorphous layer 120.

As described in detail above, the present disclosure provides a semiconductor structure and method of fabricating a semiconductor structure. The semiconductor structure includes an amorphous layer formed over an epitaxial region of the semiconductor structure in order to improve reliability. The amorphous layer is disposed between the epitaxial region and a silicide layer. The amorphous layer can be formed using materials such as silicon gallium, silicon arsenic, silicon antimony, or silicon phosphorous.

An implementation of the present disclosure is a semiconductor structure. The semiconductor structure includes an epitaxial region having a front side and a backside. The semiconductor structure includes an amorphous layer formed over the backside of the epitaxial region, wherein the amorphous layer includes silicon. The semiconductor structure includes a first silicide layer formed over the amorphous layer. The semiconductor structure includes a first metal contact formed over the first silicide layer.

Another implementation of the present disclosure is a method of fabricating a semiconductor structure. The method includes exposing a first surface and respective first portions of sidewalls of an epitaxial feature. The method includes forming an amorphous layer over the exposed first surface and the exposed first portions of the sidewalls. The method includes forming a first silicide layer over the amorphous layer. The method includes forming a first metal contact over the first silicide layer.

Yet another implementation of the present disclosure is another semiconductor structure. The semiconductor structure includes an epitaxial feature having a first side and a second side opposite to each other. The semiconductor structure includes a first silicide layer formed over the first side of the epitaxial feature. The semiconductor structure includes a first contact formed over the first silicide layer. The semiconductor structure includes an amorphous layer formed over a second side of the epitaxial feature. The semiconductor structure includes a second silicide layer formed over the amorphous layer. The semiconductor structure includes a second metal contact formed on the second silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a plurality of nanostructures vertically spaced apart from each other;
   an epitaxial feature coupled to one end of each of the plurality of nanostructures and having a front side and a backside;
   an amorphous semiconductor layer formed around the epitaxial feature on the backside;
   a first silicide layer formed over the amorphous semiconductor layer; and
   a first metal contact formed over the first silicide layer.

2. The semiconductor structure of claim 1, wherein a thickness of the amorphous semiconductor layer is between about 2 nanometers and about 10 nanometers.

3. The semiconductor structure of claim 1, further comprising:
   a second silicide layer formed over the front side of the epitaxial feature; and
   a second metal contact formed over the second silicide layer.

4. The semiconductor structure of claim 3, wherein the first silicide layer overlays a bottom surface of the epitaxial feature and extends along a lower portion of each sidewall of the epitaxial feature.

5. The semiconductor structure of claim 3, wherein the second silicide layer overlays a top surface of the epitaxial feature and extends along an upper portion of each sidewall of the epitaxial feature.

6. The semiconductor structure of claim 3, wherein the first silicide layer includes a material different from or identical to a material of the second silicide layer.

7. The semiconductor structure of claim 1, wherein the amorphous semiconductor layer further includes at least one of gallium, arsenic, antimony, or phosphorous.

8. The semiconductor structure of claim 1, further comprising a gate structure wrapping around each of the plurality of nanostructures.

9. The semiconductor structure of claim 1, wherein each of the plurality of nanostructures includes undoped or doped silicon.

10. A semiconductor structure, comprising:
    a plurality of nanostructures vertically spaced apart from each other;
    a first epitaxial feature coupled to a first end of each of the plurality of nanostructures and having a front side and a backside;

a second epitaxial feature coupled to a second, opposite end of each of the plurality of nanostructures and having a front side and a backside;
a first amorphous semiconductor layer formed around the first epitaxial feature on its backside;
a first silicide layer formed over the first amorphous semiconductor layer;
a second amorphous semiconductor layer formed around the second epitaxial feature on its backside;
a second silicide layer formed over the second amorphous semiconductor layer.

11. The semiconductor structure of claim 10, further comprising:
a first metal contact formed over the first silicide layer; and
a second metal contact formed over the second silicide layer.

12. The semiconductor structure of claim 10, wherein a thickness of each of the first and second amorphous semiconductor layers is between about 2 nanometers and about 10 nanometers.

13. The semiconductor structure of claim 10, wherein the first silicide layer overlays a bottom surface of the first epitaxial feature and extends along a lower portion of each sidewall of the first epitaxial feature, and the second silicide layer overlays a bottom surface of the second epitaxial feature and extends along a lower portion of each sidewall of the second epitaxial feature.

14. The semiconductor structure of claim 10, wherein each of the first and second amorphous semiconductor layers further includes at least one of gallium, arsenic, antimony, or phosphorous.

15. The semiconductor structure of claim 10, further comprising a gate structure wrapping around each of the plurality of nanostructures.

16. The semiconductor structure of claim 15, wherein at leas the gate structure, the plurality of nanostructures, the first epitaxial feature, and the second epitaxial feature operatively form a gate-all-around (GAA) transistor.

17. The semiconductor structure of claim 10, wherein each of the plurality of nanostructures includes undoped or doped silicon.

18. A semiconductor structure, comprising:
an epitaxial feature;
an amorphous semiconductor layer extending along a bottom surface and along a first portion of each sidewall of the epitaxial feature;
a first silicide layer formed over the amorphous semiconductor layer;
a first metal contact formed over the first silicide layer;
a second silicide layer extending along a top surface and along a second portion of each sidewall of the epitaxial feature; and
a second metal contact formed over the second silicide layer.

19. The semiconductor structure of claim 18, wherein the amorphous semiconductor layer includes silicon.

20. The semiconductor structure of claim 18, wherein the amorphous semiconductor layer further includes at least one of gallium, arsenic, antimony, or phosphorous.

* * * * *